United States Patent
Boyd et al.

(10) Patent No.: US 12,231,116 B1
(45) Date of Patent: Feb. 18, 2025

(54) DIGITAL POWER ON RESET CIRCUIT AND METHOD

(71) Applicant: Ciena Corporation, Hanover, MD (US)

(72) Inventors: Daryl Anthony Boyd, Ottawa (CA); Derek R. Mudd, Ottawa (CA)

(73) Assignee: Ciena Corporation, Hanover, MD (US)

( * ) Notice: Subject to any disclaimer, the term of this patent is extended or adjusted under 35 U.S.C. 154(b) by 1 day.

(21) Appl. No.: 18/505,262

(22) Filed: Nov. 9, 2023

(51) Int. Cl.
*H03K 17/22* (2006.01)
*G01R 31/3185* (2006.01)

(52) U.S. Cl.
CPC ..... *H03K 17/22* (2013.01); *G01R 31/318555* (2013.01)

(58) Field of Classification Search
None
See application file for complete search history.

(56) References Cited

U.S. PATENT DOCUMENTS

| | | | |
|---|---|---|---|
| 7,193,907 B2 | 3/2007 | Nakatake et al. | |
| 7,196,561 B2 * | 3/2007 | Bhattacharya | H03K 17/223 327/143 |
| 7,667,506 B2 | 2/2010 | Mawet | |
| 7,671,643 B2 | 3/2010 | Dribinsky et al. | |
| 8,055,828 B2 | 11/2011 | Conti et al. | |
| 8,547,147 B2 | 10/2013 | Huang | |
| 8,805,376 B2 | 8/2014 | Boejer et al. | |
| 10,256,809 B2 | 4/2019 | Schnaitter et al. | |
| 2023/0088630 A1 | 3/2023 | Leonardo | |

FOREIGN PATENT DOCUMENTS

| | | |
|---|---|---|
| CN | 101860690 B | 7/2012 |
| CN | 102111136 A | 5/2013 |
| CN | 104103311 A | 10/2014 |
| CN | 109582077 B | 1/2021 |
| CN | 114362732 A | 4/2022 |
| CN | 217640137 U | 10/2022 |
| JP | 2018067806 A | 4/2018 |
| JP | 2021515472 A | 6/2021 |

* cited by examiner

*Primary Examiner* — Jeffrey S Zweizig
(74) *Attorney, Agent, or Firm* — Baratta Law PLLC; Lawrence A. Baratta, Jr.

(57) ABSTRACT

A digital Power on Reset (POR) circuit includes N counters; N comparators each connected to an output of a corresponding counter of the N counters to compare with a corresponding specific value, N is an integer greater than or equal to 1; and a comparison block connected to an output of each of the N comparators and configured to output a reset signal based on the output of each of the N comparators. The digital POR circuit utilizes a complete digital design, enabling efficient integration with a processing circuit. The digital POR circuit can utilize the same libraries, cells, etc. as other digital components in the processing circuit, and can be tested with other digital components in the processing circuit.

20 Claims, 3 Drawing Sheets

DIGITAL POWER ON RESET CIRCUIT AND METHOD

FIELD OF THE DISCLOSURE

The present disclosure relates generally to digital circuits. More particularly, the present disclosure relates to a digital Power on Reset (POR) circuit and method.

BACKGROUND OF THE DISCLOSURE

A Power on Reset (POR) circuit is used in a processing circuit, such as a processor, microcontroller, Application Specific Integrated Circuit (ASIC), Field Programming Gate Array (FPGA), Digital Signal Processor (DSP), Graphics Processing Unit (GPU), Network Processing Unit (NPU), and the like, to generate a reset signal when power is applied to the processing circuit. This enables the processing circuit to start operation in a known state, e.g., default values in memory, registers, etc. For example, the POR can be used to start the processing circuit with default values in key registers for access control, boot configuration, and other system requirements. Also, for security, there can be a requirement to have the POR circuit on the processing circuit, as opposed to an external circuit connected thereto. Conventionally, POR circuits utilize analog components which are difficult to integrate, test, and operate in a processing circuit, which utilizes digital components.

BRIEF SUMMARY OF THE DISCLOSURE

The present disclosure relates to a digital POR circuit and method. In particular, the digital POR circuit utilizes a complete digital design, enabling efficient integration with the processing circuit. For example, the digital POR circuit can utilize the same libraries, cells, etc. as other digital components in the processing circuit, and can be tested with other digital components in the processing circuit. The digital POR circuit includes one or more digital counters connected to comparators configured to detect specific values on each digital counter. The digital POR circuit operates as follows:

(1) At power up, each digital counter has some random value, e.g., each bit starts as a logical 0 or logical 1-assume there is about a 50/50 chance each bit can be set as 0 or 1. The digital counter will come up at initial power up as a random value. Assume an M-bit counter, M is an integer greater than 1, the digital counter will come up at initial value of between 0 and 2M-1. For example, M=10, the digital counter will come up at initial value of between 0 and 1023.

(2) As soon as power is applied, each digital counter, starting at the initial random value, begins a count.

(3) Each digital counter is connected to a comparator which is set to compare an output from the counter to a specific value. Each digital counter will start at its random value and count until the specific value. At this point, each digital counter stops counting and remains at its specific value.

(4) In an example, a reset is present as long as each digital counter is not at its specific value based on the associated comparator, otherwise the reset is withheld or de-asserted, while each digital counter is at its specific value. In other embodiments, an output signal can be raised when each digital counter is at its specific value, and the output signal can be used as a reset.

In this manner, the digital POR circuit is a probability-based implementation. It leverages the randomness of flops being either 0 or 1 at startup and then the counting until the specific value, to implement an all-digital POR circuit. That is, the digital counters will not start counting until the power is supplied and when they reach and remain at the specific value, the reset is asserted, withdrawn, etc. (based on the specific implementation), thereby providing an all-digital POR implementation. As described herein, a flop is a hardware component in the digital counter that has a 0 or 1 value and each flop comes up at startup in one of these values, at random. If there is a transient power loss (where power is returned quickly), the digital POR's digital counters may keep their values, at the specific values, thereby not causing a reset. Conversely, if there is a power loss for a time, the digital POR's digital counters come back in a new state, i.e., random values, and start counting.

A digital Power on Reset (POR) circuit includes N counters; N comparators each connected to an output of a corresponding counter of the N counters and configured to compare with a corresponding specific value, N is an integer greater than or equal to 1; and a comparison block connected to an output of each of the N comparators and configured to output a reset signal based on the output of each of the N comparators. At power up, each of the N counters assume a random value for each bit therein and begin to count sequentially until each of the N counters reaches the corresponding specific value.

Each of the N counters can include M-bits, M is an integer greater than or equal to 1, such that the digital POR circuit includes N×M flops. At power up, each of the N counters assume a random value for the M-bits, and begins to count sequentially until each of the N counters reaches the corresponding specific value. In an embodiment, N>1 and M>4. The output of each of the N comparators can be connected to a corresponding counter of the N counters to cause the corresponding counter to stop counting once the corresponding specific value is reached. The corresponding specific value for each of the N counters can be selected to balance a number of high and low bits. The corresponding specific value for each of the N counters can be a different value.

The comparison block can be configured to either (1) assert the reset signal until all of the N counters have reached their corresponding specific value or (2) assert the reset signal when all of the N counters have reached their corresponding specific value. The digital POR circuit can be integrated with a processing device and utilizes a same technology node as the processing device.

In another embodiment, a method for implementing a digital Power on Reset (POR) circuit includes, responsive to receiving power at N counters, incrementing the N counters, N is an integer greater than or equal to 1; comparing an output of each of the N counters to a corresponding specific value; and configuring a reset signal based on the comparing, such that the reset signal is in a first state when all of the N counters are not at their corresponding specific value and the reset signal is in a second state when all of the N counters are at their corresponding specific value.

In a further embodiment, a processing device includes digital logic configured to perform one or more functions; and a digital Power on Reset (POR) circuit integrated with the digital logic, wherein the digital POR circuit includes N counters, N comparators each connected to an output of a corresponding counter of the N counters to compare with a corresponding specific value, N is an integer greater than or equal to 1, and a comparison block connected to an output of each of the N comparators and configured to output a reset signal based on the output of each of the N comparators, wherein the reset circuit is used to reset some or all of the digital logic based on power up. The processing device can be one of a processor, a microcontroller, an Application Specific Integrated Circuit (ASIC), a Field Programming Gate Array (FPGA), a Digital Signal Processor (DSP), a Graphics Processing Unit (GPU), and a Network Processing Unit (NPU).

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Again, the present disclosure relates to a digital POR circuit and method.

Overview

Figure 1:
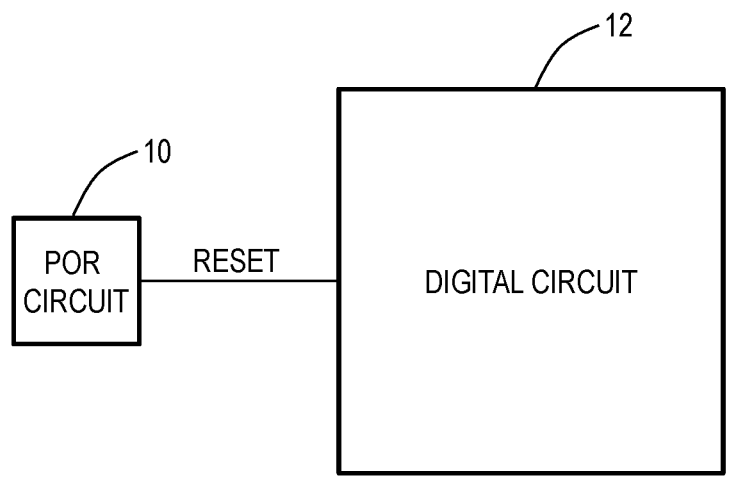
FIG. 1 is a block diagram of a POR circuit located externally from and connected to a processing circuit.
Figure 2:
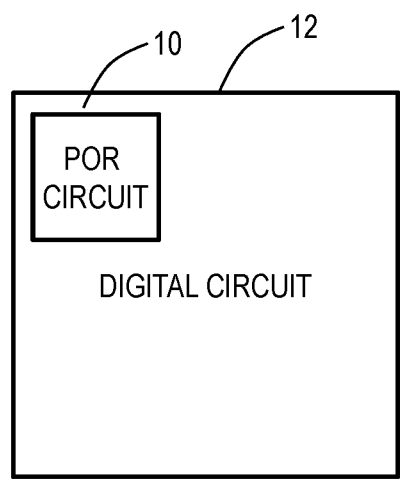
FIG. 2 is a block diagram of the POR circuit integrated within the processing circuit.

FIG. 1 is a block diagram of a POR circuit 10 located externally from and connected to a processing circuit 12. FIG. 2 is a block diagram of the POR circuit 10 integrated within the processing circuit 12. Again, the POR circuit 10 is responsible for generating a reset signal to the processing circuit 12. Variously, the processing circuit 12 can be any digital logic circuit, including, without limitation, a processor, a microcontroller, an ASIC, an FPGA, a DSP, an NPU, a GPU, and the like. That is, the processing circuit 12 is a chip, integrated circuit, die, etc., in a single package. The package can include pins, etc. and is configured to operate in an electronic system, such as on a Printed Circuit Board (PCB), PCB Assembly (PCBA), etc. Those skilled in the art will recognize the processing circuit 12 can be any digital logic device that requires a reset once powered on. Upon powering up the processing circuit 12, various registers, memory, etc. can be in a random state and the POR circuit 10 is configured to put the processing circuit 12 in a known state. Without this reset on power on, the processing circuit 12 may not operate properly.

Conventional POR circuits 10 are analog implementations. That is, some combination of resistors, capacitors, oscillators, etc. which are configured to monitor an incoming voltage and assert a reset until there is a stable voltage at or above some threshold. In FIG. 1, the POR circuit 10 located externally from the processing circuit 12. Advantageously, this separates the analog components in a conventional implementation from the digital components in the processing circuit 12. However, this may pose a security problem as the reset is applied or withdrawn externally from the processing circuit 12. As an example, it is well-known that mobile phones are configured to require a passcode on restart. This functionality can be implemented based on a POR circuit 10 included therein. Allowing an external POR circuit could provide a malicious actor an opportunity to circumvent this passcode on restart by manipulating the external POR circuit or the connection between the external POR circuit and a device.

As such, a better and more secure practice is to include the POR circuit 10 within the processing circuit 12, as shown in FIG. 2. However, there are challenges with using an analog implementation for the POR circuit 10 integrated with the processing circuit 12, as described as follows.

Analog POR Integrated with a Processing Circuit

Voltage-specifically, an analog POR is configured to detect an incoming voltage to the processing circuit 12. In general, the POR circuit 10 functionally is configured to assert a reset once stable power is detected. In an analog implementation, this typically includes resistors, capacitors, oscillators, etc. configured to activate (or deactivate, depending on the implementation) a reset signal once a stable predetermined voltage threshold is detected for some time.

As power consumption is a critical operating feature due to thermal requirements and power efficiency, there are implementations of the processing circuit 12 that do not use standard logic voltages, to reduce overall system power. In some embodiments, this results in the voltage being very close to the predetermined voltage threshold where the digital/analog cells operate. With analog POR circuits, the core power supply is compared against a reference voltage, i.e., the predetermined voltage threshold. The margin between the reference voltage and our core power supply can sometimes be so low that there is too much risk in typical analog POR designs.

Dynamic Voltage Drop (DVD)—DVD refers to the transient voltage drop that a local power grid on the processing circuit 12 might experience if there is a rapid change in current. Also, with the core power supply at lower values, the processing circuit 12 tends to operate with a larger DVD range. Any analog based POR circuit would need to not fire (reset) in the presence of DVD or the margin between core and reference would need to be larger than the DVD budget. With the core power supply at lower values, this is not possible.

Analog test—to verify the processing circuit 12 is working properly, an analog test program would need to be created and executed on a tester, or a digital test would need to be created for the analog design. This requires additional testing circuits on the processing circuit 12. All options add cost to the device (additional tester time, additional silicon area, etc.). As the present disclosure provides a digital POR circuit design, i.e., via all digital components, the testing of the digital POR circuit 10 can be performed as part of a regular digital testing program for the processing circuit 12 with no additional designs needed.

Verification—an analog POR on the processing circuit 12 integrates analog components with digital components. Again, as the present disclosure provides a digital POR circuit design, the processing circuit 12 can be tested using normal verification simulations, i.e., there is not a need for mixed digital/analog verification.

Bypass—due to the risks associated with an analog POR failing and the fact that the POR circuit is used to secure the debug/boot of the processing circuit 12, the risk is too high that a defective POR would result in a DOA (dead on arrival) processing circuit 12 means we either want to initially disable the POR circuit 10 and enable it after its validated (e.g., a second ASIC spin), or, we have a bypass mechanism that can be used to disable/enable it via metal. All this results in additional complexity (waiting on respins before release), or additional costs (masks, device respins).

Since the present disclosure provides the digital POR circuit as an all-digital implementation, each of the previous issues is mitigated. This removes program risk as this design is 100% digital and will function as expected as long as the processing circuit 12 is not defective and meets timing. Of course, if these parameters are not met, the rest of the processing circuit 12 would also be defective, i.e., a bad part. This approach meets device security requirements (secure boot, Joint Test Action Group (JTAG) access, etc.) without using an analog POR circuit and its associated risks.

Also, with advanced technology nodes, i.e., a specific manufacturing process that governs the dimensions, transistor characteristics, and performance capabilities of integrated circuits (the processing device 12), analog POR circuits are not already available in the nodes and must be developed at the same time as we are developing the processing device 12. They also need space on test chips and there is risk that a bad test chip result late in the program might result in removal of the feature, or delay in the program. The digital POR circuit is made using standard digital cells used throughout the rest of the processing device 12. Also, with analog POR circuits, we would need to pay for a new development per technology node. With the digital POR, we can use the same proven design in all future technology nodes.

Digital POR Circuit

Figure 3:
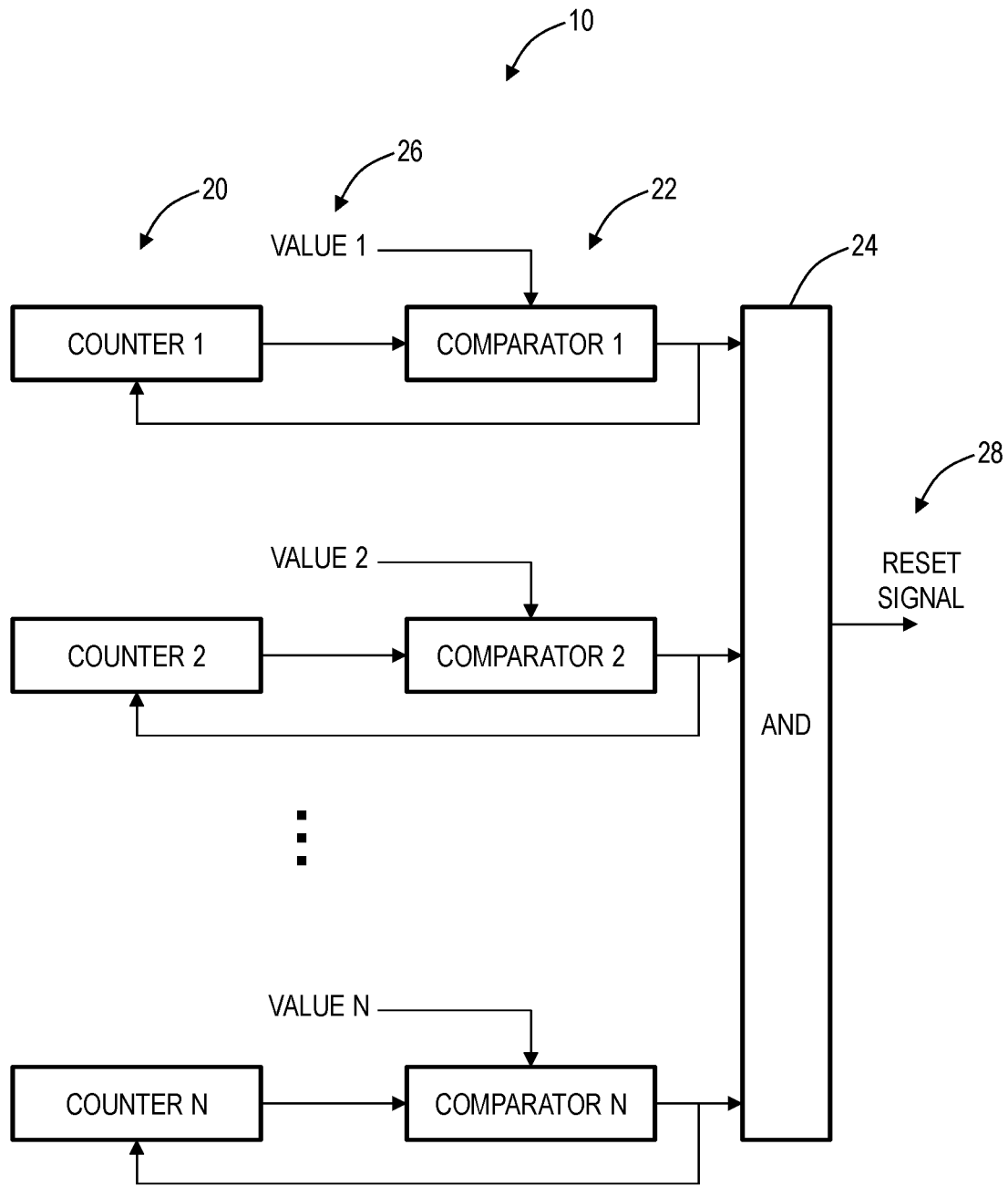
FIG. 3 is a block diagram of a digital POR circuit.

FIG. 3 is a block diagram of a digital POR circuit 10. FIG. 3 is a functional diagram of the digital components which include N counters 20, N comparators 22, and a comparison block 24 configured to receive a result from each of the N comparators 22. N is an integer greater than or equal to 1. Specifically, the digital POR circuit 10 can use a single counter 20 as well as multiple counters 20. This is discussed further herein. Each of the N counters 20 connect to a corresponding comparator of the N comparators 22. Each of the N comparators 22 is configured to compare a value from a corresponding counter 20 with a specific value 26, i.e., value 1, value 2, . . . value N. An output of each of the N comparators 22 will be based on whether or not the current value of the corresponding counter 20 matches the corresponding specific value 26.

The counters 20 include flops that on powerup, without a reset, will come up in an unknown state and its extremely difficult to influence the initial state of a particular flop. The digital POR circuit 10 design uses a chosen number of flops organized as several free running counters. The counters 20 start at a random value and will count until they reach a preset value, i.e., the specific value 26, and then stop. The comparison block 24 can be a security flop that is asynchronously set when any of the counters 20 are not equal to their presets. That is, the specific values 26 can be referred to as presets, threshold values, predetermined values, etc. Once all the counters 20 have reached their preset values, the security flop, the comparison block 24, is allowed to clear. The security flop is used to generate a reset signal 28. As described herein, the output is described as the reset signal 28 and those skilled in the art will recognize the reset signal 28 could be referred to as an output signal, i.e., the reset signal 28 is one example of an output signal. Also, the counters 20 can have an input from the comparator's 22 output as well and use this input to stop counting once the specific value 26 is obtained.

Again, the digital POR circuit 10 contemplates integration with the processing device 12, as illustrated in FIG. 2. Of note, those skilled in the art will recognize that an actual implementation can vary. In an embodiment, the reset signal 28 can be generated once all the counters 20 reach their preset values. In another embodiment, the reset signal 28 can be withdrawn once all the counters 20 reach their preset values. That is, the act of providing the reset signal 28 to the processing circuit 12 can use any implementation, assert, de-assert, generate, withdraw, etc. Of note, the digital POR circuit 10 is configured to generate the implementation-specific reset signal 28 based on all counters 20 reaching and maintaining their specific value 26.

The specific values 26 can be arbitrary. In an embodiment, the specific values 26 can all be the same value. In another embodiment, the specific values 26 can be different for each counter 20. In a further embodiment, the specific values 26 can be selected as a value where half of the bits are high (1) and half of the bits are low (0). In further embodiment, the specific values 26 can be selected as value where there is some balance between the bits as high (1) and low (1), but not necessarily half. Of course, an implementation can use a combination of the foregoing approaches.

Each counter 20 is an M-bit counter, M is an integer greater than 1, and the digital counter will come up at initial value of between 0 and $2^M-1$. For example, M=10, a given counter 20 will come up at initial value of between 0 and 1023. Assume, this counter's 20 specific value 26 is 1010101010. The counter 20 will come up at power on at some random value between 0 and 1023, and keep counting until the counter 20 comes to 1010101010. Note, if the initial value is higher than the specific value 26, the counter 20 will count to $2^M-1$ and roll over to 0 until the specific value 26 is matched.

Accordingly, the digital POR circuit 10 operates as follows:
(1) At power up, each of the N counters 20 has some random value, e.g., each bit starts as a logical 0 (low) or logical 1 (high)-assume there is about a 50/50 chance each bit can be set as 0 or 1.
(2) Each of the N counters 20, starting at the initial random value, begins a count.
(3) The comparator 22 for each of the N counters 20 compares and output from a corresponding counter 20 to a corresponding specific value 26. That is, each of the N counters 20 will start at its random value and count until the specific value 26 based on the comparator. At this point, each of the N counters 20 stops counting and remains at its specific value 26.
(4) A reset signal is set when all of the N counters 20 is at their specific values 26. For example, as long as each of the N counters 20 is not at its specific value 26, a reset signal 28 is applied, otherwise the reset signal 28 is withheld or de-asserted, while each of the N counters 20 is at its specific value 26.

Again, the digital POR circuit 20 is a probability-based implementation that leverages the randomness of flops in each of the N counters 20 being either 0 or 1 at startup and then the counting until the specific value 26. Each of the N counters 20 will not start counting until the power is supplied and when they reach and remain at the specific value, the reset signal 28 is asserted, withdrawn, etc. (based on the specific implementation), thereby providing an all-digital POR implementation. As described herein, a flop is a hardware component in the digital counter that has a 0 or 1 value and each flop comes up at startup in one of these values, at random. If there is a transient power loss (where power is returned quickly), the digital POR's digital counters keep their values, at the specific values, thereby not causing a reset. Conversely, if there is a power loss for a time, the digital POR's digital counters come back in a new state, i.e., random values, and start counting.

In a practical implementation, we need to select a set number of bits to ensure the randomness. For example, if there is a single counter 20 with 2-bits, there is a 50/50 probability the single counter 20 will come up at the specific value 26. This is not a useful implementation. As such, there is a need for a sufficient number of flops (bits) in the N counters 20 for this probability-based implementation to be practical.

For the purpose of calculations an assumption is that any flops has about 50/50 chance of coming up as a 1. The number of flops in total is chosen so the probability of all flops happening to come up in a value that matches the specific value 26 is extremely rare, i.e., infinitesimally rare, such as occurring once in tens of billions of years (the age of the universe). In an embodiment, it is possible to choose enough flops such that it will happen once in the current lifetime of the universe. This only requires about 64 flops and note the maximum counter duration is also a function of the frequency of the circuit.

The digital POR circuit 10 can include M×N flops, where M and N are both integers greater than or equal to 1. The N counters 20 each can be an M-bit counter. In various practical implementations, there can be between around 50-100 flops, or more particularly 60-80 flops. This is sufficient for the probability-based implementation. A smaller number, say less than 60 or so, increases the odds that the digital POR circuit 10 comes up with the exact values of the specific values 26. A larger number increases the time for the counters 20 to converge to the specific values 26.

In one embodiment, there can be a single counter 20 (N=1) of M-bits, e.g., 60-80 flops. It was determined that a single counter 20 takes more times to count and reach the specific value 26. For example, assume a 60-bit counter 20 (M=60, N=1), this could potentially require 260-1 cycles to reach the specific value 26. However, it is possible to parallelize this implementation and achieve the same randomness. Specifically, having multiple counters 20, i.e., N>1, allows an implementation with the same number of flops, but faster convergence to the specific values 26. For example, having 6 (N=6) 10-bit counters 20 (M=10) supports the same randomness as a single 60-bit counter, i.e., both have 60 flops, but will reach the specific values 26 in a shorter time on average than the single 60-bit counter. For example, some arrangements with 4-12 counters (N=4 to 12) and each counter have 8-12 bits will converge (i.e., reach the specific values 26) on the order of several microseconds, which is sufficient for most applications.

The reset signal 28 can be implementation specific depending on how you want to signal reset to the processing device 12. In an embodiment, the digital POR circuit 10 provides the reset signal 28 even in the absence of an external reset or in the absence of a clock. That is, the arrangement of counters, comparators, and compared values can be selected such that the reset signal 28 will be present even if a clock is not present, or the reset signal 28 is withheld. This makes the design resilient to attack where a hacker will try and defeat the security of the processing device 12 by withholding resets, clocks and other signals. That is, conventional approaches with POR circuits may assert a reset. In an embodiment, the present disclosure has the digital POR circuit 10 do the opposite, namely de-assert or remove the reset signal 28. This is a more secure approach.

Applications

The digital POR circuit 10 contemplates use in any type of processing device 12 to provide the reset signal 28 when a corresponding device with the processing device 12 is first powered on, establishing default values on key registers. Of note, the selection of M and N can be based on the need for security as the digital POR circuit 10 is used to establish an initial state for key registers in the device used to control access, boot, and to meet other system requirements.

Due to the digital implementation, it is expected the digital POR circuit 10 can be used in practically any application for the processing device 12.

Digital POR Circuit

In an embodiment, a digital POR circuit 10 includes N counters 20, N comparators 22 each connected to an output of a corresponding counter 20 of the N counters 20 to compare with a corresponding specific value 26, N is an integer greater than or equal to 1; and a comparison block 24 connected to an output of each of the N comparators 22 and configured to output a reset signal 28 based on the output of each of the N comparators 22.

At power up, each of the N counters 20 assume a random value for each bit therein and begin to count sequentially until each of the N counters 20 reaches the corresponding specific value 26. Each of the N counters 20 can include M-bits, M is an integer greater than or equal to 1, such that the digital POR circuit 10 includes N×M flops. At power up, each of the N counters 20 assume a random value for the M-bits, and begins to count sequentially until each of the N counters 20 reaches the corresponding specific value 26. In an example embodiment, N>1 and M>4.

The output of each of the N comparators 22 can be connected to a corresponding counter 20 of the N counters 20 to cause the corresponding counter 20 to stop counting once the corresponding specific value 26 is reached. The corresponding specific value 26 for each of the N counters 20 can be selected to balance a number of high and low bits. The corresponding specific value 26 for each of the N counters can be a different value. The comparison block 24 can be configured to assert the reset signal 28 until all of the N counters 20 have reached their corresponding specific value 26. The digital POR circuit 10 can be integrated with a processing device 12 and utilize a same technology node as the processing device 12. The processing device 12 can be one of a processor, a microcontroller, an Application Specific Integrated Circuit (ASIC), a Field Programming Gate Array (FPGA), a Digital Signal Processor (DSP), a Graphics Processing Unit (GPU), and a Network Processing Unit (NPU).

Process

Figure 4:
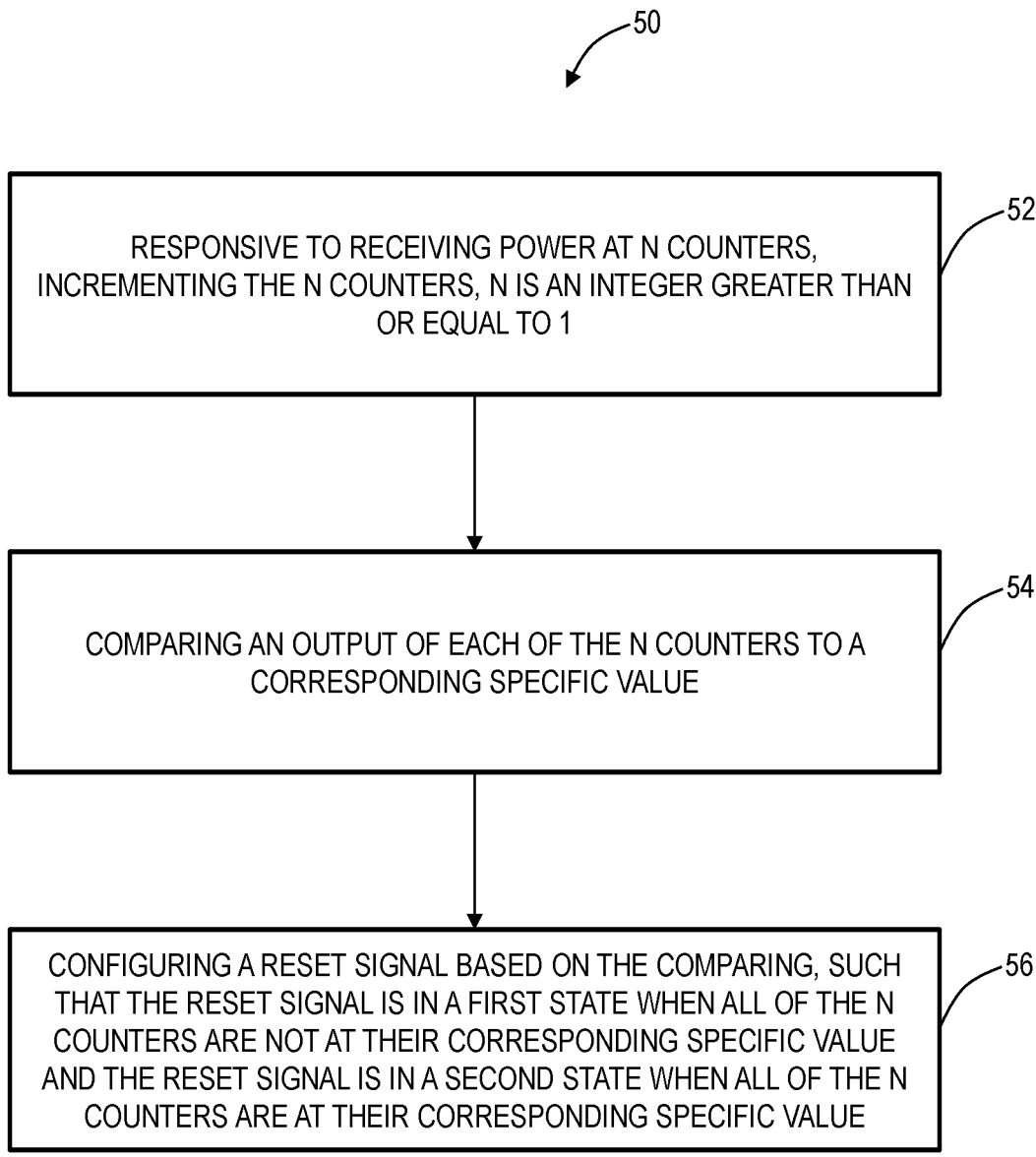
FIG. 4 is a flowchart of a process for implementing a digital Power on Reset (POR) circuit.

FIG. 4 is a flowchart of a process 50 for implementing a digital Power on Reset (POR) circuit. The process 50 includes, responsive to receiving power at N counters, incrementing the N counters, N is an integer greater than or equal to 1 (step 52); comparing an output of each of the N counters to a corresponding specific value (step 54); and configuring a reset signal based on the comparing, such that the reset signal is in a first state when all of the N counters are not at their corresponding specific value and the reset signal is in a second state when all of the N counters are at their corresponding specific value (step 56).

Prior to the receiving power, the N counters have no values, and after the receiving power, each of the N counters assume a random value for each bit therein. Each of the N counters can include M-bits, M is an integer greater than or equal to 1, such that the digital POR circuit includes N×M flops. Responsive to the receiving power, each of the N counters assume a random value for the M-bits. In an embodiment, N>1 and M>4. Of note, each of the N counters does not necessarily have to have the same number of bits (M-bits), e.g., there can be some embodiments where the N counters include a 10-bit counter, an 8-bit counter, etc.

The process 50 can further include providing a result for the comparing the output of each of the N counters to each of the N counters to cause the corresponding counter to stop the incrementing once the corresponding specific value is reached. The corresponding specific value for each of the N counters can be selected to balance a number of high and low bits. The corresponding specific value for each of the N counters can be a different value.

Of note, the present disclosure utilizes counters as this is a more secure implementation. Specifically, another approach can include use of a shift register which comes up at some value and then shifts until all bits are shifted to either all 1s or all 0s. Instead, our approach uses one or more counters which also come up at some value and then count until a specific value is reached. In our approach, the specific value can include both 0 and 1 values, as opposed to all 1s or all 0s with the shift register. With a shift register approach, it is possible to influence start up conditions to influence all flops towards ones. The counter approach with a specific value (that is not all 1s) requires influencing some flops, but not others which is significantly harder if not impossible. Further, a malicious actor will not know the specific value. Even further, the approach described herein with counters requires significantly less flops to reduce the likelihood of all bits coming up in a known state and being defeated, i.e., our implementation with a modest number of flops can make the probability of all flops happening to come up in a value that matches the specific value infinitesimally rare, i.e., something that should occur on average about once in the entire age of the universe.

System Verilog Example

The following SystemVerilog (SV) code describes an example implementation of the digital POR circuit 10. Those skilled in the art will appreciate this is one example for illustration purposes; other implementations are contemplated.

```
module digdet (
clk,
aresetN,
o_por,
o_por_N);
input clk;
input aresetN;
output o_por;
output o_por_N;
reg securereg;
reg [7:0] cnt1;
reg [7:0] cnt2;
reg [7:0] cnt3;
reg [7:0] cnt4;
reg [7:0] cnt5;
reg [7:0] cnt6;
reg [7:0] cnt7;
reg [7:0] cnt8;
wire IDmatch1=(cnt1=='VALUE1);
wire IDmatch2=(cnt2=='VALUE2);
wire IDmatch3=(cnt3=='VALUE3);
wire IDmatch4=(cnt4=='VALUE4);
wire IDmatch5=(cnt5=='VALUE5);
wire IDmatch6=(cnt6=='VALUE6);
wire IDmatch7=(cnt7=='VALUE7);
wire IDmatch8=(cnt8=='VALUE8);
wire IDmatch=((IDmatch1==1) && (IDmatch2==1) && (IDmatch3==1) & (IDmatch4==1) & &
   (IDmatch5==1) && (IDmatch6==1) && (IDmatch7==1) & &
(IDmatch8==1));
wire IDmatch_or_aresetN=(IDmatch==0) | | (aresetN==0);
assign o_por=securereg;
assign o_por_N=~ o_por;
always @ (posedge clk) begin
if (!IDmatch1) cnt1<=cnt1±1; //roll, no reset
if (!IDmatch2) cnt2<=cnt2+1; //roll, no reset
if (!IDmatch3) cnt3<=cnt3+1; //roll, no reset
if (!IDmatch4) cnt4<=cnt4+1; //roll, no reset
if (!IDmatch5) cnt5<=cnt5+1; //roll, no reset
if (!IDmatch6) cnt6<=cnt6+1; //roll, no reset
if (! IDmatch7) cnt7<=cnt7+1; //roll, no reset
if (!IDmatch8) cnt8<=cnt8+1; //roll, no reset
end
always @ (posedge clk or posedge IDmatch or aresetN)
begin
   if (IDmatch or aresetN) begin
   securereg <=1; //secure state
   end else begin
   securereg <=0; //controlled state
   end
end
endmodule
```

CONCLUSION

It will be appreciated that some embodiments described herein may include one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field Programmable Gate Arrays (FPGAs); and the like along with unique stored program instructions (including software and/or firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured or adapted to," "logic configured or adapted to," "a circuit configured to," "one or more circuits configured to," etc. perform a set of operations, steps, methods, processes, algorithms, functions, techniques, etc. on digital and/or analog signals as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims. Further, the various elements, operations, steps, methods, processes, algorithms, functions, techniques, modules, circuits, etc. described herein contemplate use in any and all combinations with one another, including individually as well as combinations of less than all of the

What is claimed is:

1. A digital Power on Reset (POR) circuit comprising:
N counters;
N comparators each connected to an output of a corresponding counter of the N counters and configured to compare with a corresponding specific value, N is an integer greater than or equal to 1; and
a comparison block connected to an output of each of the N comparators and configured to output a reset signal based on the output of each of the N comparators.

2. The digital POR circuit of claim 1, wherein, at power up, each of the N counters assume a random value for each bit therein and begin to count sequentially until each of the N counters reaches the corresponding specific value.

3. The digital POR circuit of claim 1, wherein each of the N counters include M-bits, M is an integer greater than or equal to 1, such that the digital POR circuit includes N×M flops.

4. The digital POR circuit of claim 3, wherein, at power up, each of the N counters assume a random value for the M-bits, and begins to count sequentially until each of the N counters reaches the corresponding specific value.

5. The digital POR circuit of claim 3, wherein N>1 and M>4.

6. The digital POR circuit of claim 1, wherein the output of each of the N comparators is connected to a corresponding counter of the N counters to cause the corresponding counter to stop counting once the corresponding specific value is reached.

7. The digital POR circuit of claim 1, wherein the corresponding specific value for each of the N counters is selected to balance a number of high and low bits.

8. The digital POR circuit of claim 1, wherein the corresponding specific value for each of the N counters is a different value.

9. The digital POR circuit of claim 1, wherein the comparison block is configured to either (1) assert the reset signal until all of the N counters have reached their corresponding specific value or (2) assert the reset signal when all of the N counters have reached their corresponding specific value.

10. The digital POR circuit of claim 1, wherein the digital POR circuit is integrated with a processing device and utilizes a same technology node as the processing device.

11. A method for implementing a digital Power on Reset (POR) circuit, the method comprising steps of:
responsive to receiving power at N counters, incrementing the N counters, N is an integer greater than or equal to 1;
comparing an output of each of the N counters to a corresponding specific value; and
configuring a reset signal based on the comparing, such that the reset signal is in a first state when all of the N counters are not at their corresponding specific value and the reset signal is in a second state when all of the N counters are at their corresponding specific value.

12. The method of claim 11, wherein, prior to the receiving power, the N counters have no values, and after the receiving power, each of the N counters assume a random value for each bit therein.

13. The method of claim 11, wherein each of the N counters include M-bits, M is an integer greater than or equal to 1, such that the digital POR circuit includes N×M flops.

14. The method of claim 13, wherein, responsive to the receiving power, each of the N counters assume a random value for the M-bits.

15. The method of claim 13, wherein N>1 and M>4.

16. The method of claim 13, wherein the steps further include providing a result for the comparing to each of the N counters to cause the corresponding counter to stop the incrementing once the corresponding specific value is reached.

17. The method of claim 13, wherein the corresponding specific value for each of the N counters is selected to balance a number of high and low bits.

18. The method of claim 13, wherein the corresponding specific value for each of the N counters is a different value.

19. A processing device comprising:
digital logic configured to perform one or more functions; and
a digital Power on Reset (POR) circuit integrated with the digital logic, wherein the digital POR circuit includes
N counters,
N comparators each connected to an output of a corresponding counter of the
N counters to compare with a corresponding specific value, N is an integer greater than or equal to 1, and
a comparison block connected to an output of each of the N comparators and configured to output a reset signal based on the output of each of the N comparators, wherein the reset circuit is used to reset some or all of the digital logic based on power up.

20. The processing device of claim 19, wherein the processing device is one of a processor, a microcontroller, an Application Specific Integrated Circuit (ASIC), a Field Programming Gate Array (FPGA), a Digital Signal Processor (DSP), a Graphics Processing Unit (GPU), and a Network Processing Unit (NPU).

* * * * *